United States Patent
Han et al.

(10) Patent No.: US 7,443,678 B2
(45) Date of Patent: Oct. 28, 2008

(54) FLEXIBLE CIRCUIT BOARD WITH HEAT SINK

(75) Inventors: Wei-Kuo Han, Hsinchu (TW); Ra-Min Tain, Hsinchu (TW)

(73) Assignee: Industrial Technology Research Institute, Hsinchu (TW)

(*) Notice: Subject to any disclaimer, the term of this patent is extended or adjusted under 35 U.S.C. 154(b) by 96 days.

(21) Appl. No.: 11/464,870

(22) Filed: Aug. 16, 2006

(65) Prior Publication Data

US 2007/0076381 A1   Apr. 5, 2007

(30) Foreign Application Priority Data

Aug. 18, 2005   (TW) .............................. 94128259 A

(51) Int. Cl.
*H05K 7/20* (2006.01)
*H01L 23/36* (2006.01)

(52) U.S. Cl. ...................... 361/704; 361/699; 361/709; 361/715; 361/719; 165/80.3; 165/104.33; 174/16.3; 174/252; 385/14; 385/89; 257/88; 257/99

(58) Field of Classification Search ................ 361/704, 361/709, 710, 715, 717, 719–722; 165/80.3, 165/80.4, 104.33, 185; 174/16.3, 252; 257/718–722, 257/785; 385/14, 33, 35, 39, 49, 52, 88, 385/89, 92–94, 129–132; 29/890.03
See application file for complete search history.

(56) References Cited

U.S. PATENT DOCUMENTS

| 5,586,004 | A * | 12/1996 | Green et al. ................ 361/699 |
| 5,653,280 | A * | 8/1997 | Porter ....................... 165/80.3 |
| 5,829,512 | A * | 11/1998 | August ........................ 165/46 |
| 6,367,541 | B2 * | 4/2002 | McCullough .............. 165/80.3 |
| 6,763,156 | B2 * | 7/2004 | Palmer et al. ................ 385/14 |
| 6,799,902 | B2 * | 10/2004 | Anderson et al. ............. 385/89 |
| 6,867,377 | B2 * | 3/2005 | Anderson et al. ........... 174/254 |
| 6,919,504 | B2 * | 7/2005 | McCutcheon et al. ...... 174/16.3 |
| 6,936,835 | B2 * | 8/2005 | Nishiyama et al. ..... 250/559.41 |
| 2006/0118969 | A1 * | 6/2006 | Yuan ......................... 257/778 |

FOREIGN PATENT DOCUMENTS

DE         19707514 A1 *  8/1998
JP       407022654 A  *  1/1995

* cited by examiner

*Primary Examiner*—Michael V Datskovskiy
(74) *Attorney, Agent, or Firm*—Allen, Dyer, Doppelt, Milbrath & Gilchrist, P.A.

(57) ABSTRACT

A novel flexible circuit board with heat dissipation ability is provided. The flexible circuit board includes a heat sink and a heat spreader having at least one circuit substrate mounted thereon. The heat spreader has a first lower surface and a first upper surface which has a plurality of first grooves formed thereon. At least one platform is formed between two adjacent ones of the first grooves for mounting the at least one circuit substrate. The heat sink has a second lower surface and a second upper surface which has a plurality of second grooves formed thereon and is connected to the first lower surface.

17 Claims, 4 Drawing Sheets

FLEXIBLE CIRCUIT BOARD WITH HEAT SINK

FIELD OF THE INVENTION

The present invention relates to a flexible circuit board, and in particular to a flexible circuit board having a heat sink bonded therewith.

BACKGROUND OF THE INVENTION

Due to the rapid developments of the information applications (IA) platform and the communication system as well as the development of the consumer electronics toward the trend of the "light-weight, thin, short and small" design, the development of the flexible circuit board (soft circuit board) is becoming more and more important. The conventional flexible circuit board is typically formed by a plastic substrate coated with copper foil. However, such a flexible circuit board usually cannot stand the heat generated from the operation of the high power electronic components mounted on the circuit board since the laminar structure of the circuit board can be delaminated due to the deformation of circuit board. Therefore, the conventional flexible circuit board faces the problem for the application of the high power electronic.

Meanwhile, it is well-known that the conventional circuit board with higher heat dissipation capability usually includes a metal plate having a relatively higher thermal conductivity as a lower layer, a circuit formed by the copper foil mounted on the metal plate, and an insulation layer made of the insulation paste, the insulation glass or the resin substrate being formed between the metal plate and the circuit. However, when such a circuit board is bent, the upper and the lower layers of the circuit board would be deformed by the compression stress and the tension stress respectively occurring thereon. Accordingly, a shear stress will occur at the bonded portion between the upper and the lower layers and cause the laminar structure of the circuit board being delaminated if the shear stress is larger than the bonded strength. Accordingly, the conventional circuit board with higher heat dissipation is not suitable for the flexibility application since the laminar structure can be damaged when the circuit board is bent.

Furthermore, please refer to FIG. 1, which shows a planar heat dissipation substrate disclosed in the U.S. Pat. No. 5,698,866. The planar heat dissipation substrate 100' includes a heat sink 10' and a heat spreader 20' having a plurality of high power LEDs 35' mounted thereon. With the design of such planar heat dissipation substrate 100', the heat generated by the high power LEDs 35' can be easily removed by the heat sink 10' and the heat spreader 20'. However, the respective light paths projected from those high power LEDs 35' will be almost perpendicular to the planar heat dissipation substrate 100' since the planar heat dissipation substrate 100' is not applicable for the flexible purpose. Moreover, please refer to FIG. 2, which shows a further optoelectronic device disclosed in the U.S. Pat. No. 5,660,461. As shown in FIG. 2, the conventional optoelectronic device 200' is composed of a plurality of LED modules 45' mounted on the heat dissipation substrate 40'. The heat dissipation substrate 40' is formed by an electrically conductive and heat conductive metal base. Furthermore, a heat sink structure 43' is attached on the lower side of the dissipation substrate 40' while the LED modules 45' are mounted on the opposite side of the dissipation substrate 40', so as to form an LED array. As shown in FIG. 2, each of the LED modules 45' has the latch structures 41', 42' in each side of the metal base for connecting with each other. However, although the latch structures 41', 42' can be used as a hinge for bending the LED array, it is obvious that the flexibility of such structure is still not good enough for many demanded applications. Moreover, such optoelectronic device structure is also complicated and costly since many components should be assembled together.

Based on the above, it is the main aspect of the present invention to provide a novel flexible circuit board which simultaneously has the flexibility and the heat dissipation ability and is suitable for the high power electronic application.

SUMMARY OF THE INVENTION

It is a first aspect of the present invention to provide a novel flexible substrate with heat dissipation ability. The flexible substrate includes at least one circuit boards a heat spreader, and a heat sink. The at least one circuit board has an insulation layer and at least one conductive layer formed thereon. The heat spreader has a first lower surface and a first upper surface which has a plurality of first grooves formed thereon. At least one platform is formed between two adjacent ones of the first grooves for mounting the at least one circuit board. The heat sink has a second lower surface and a second upper surface which has a plurality of second grooves formed thereon and is connected to the first lower surface.

Preferably, the at least one conductive layer is patterned to form a circuit.

Preferably, the plurality of first and the plurality of second grooves are the buffer areas when the flexible circuit board is bent.

Preferably, the plurality of second grooves on the second upper surface have dispositions corresponding to those of the plurality of first grooves on the first upper surface.

Preferably, the insulation layer is formed by one of a resin material and a ceramic material.

Preferably, the conductive layer is formed by a metal material.

Preferably, the heat spreader is formed by one selected from the group consisting of copper, aluminum, and graphite.

Preferably, the second lower surface further includes a plurality of fins formed thereon.

It is a second aspect of the present invention to provide a novel flexible optoelectronic device. Specifically, the flexible optoelectronic device includes at least one circuit board having an LED package module formed thereon, a heat spreader having a plurality of grooves formed thereon, at least one platform formed between two adjacent ones of the plurality of grooves for mounting the circuit board, and a heat sink attached to the heat spreader for absorbing a heat from the heat spreader.

Preferably, the plurality of grooves are the buffer areas when the flexible optoelectronic device is bent.

Preferably, the LED package module has an irradiation direction which is adjustable by deforming widths of the grooves.

Preferably, the heat sink further includes a plurality of fins.

Preferably, the at least one circuit board has a resin substrate.

Preferably, the heat spreader is formed by one selected from the group consisting of copper, aluminum, and graphite.

It is a further aspect of the present invention to provide a novel flexible substrate with heat dissipation ability. Specifically, The flexible substrate includes a heat spreader having a plurality of first grooves formed thereon and at least one platform formed between two adjacent ones of the plurality of first grooves, and a heat sink attached to the heat spreader.

Preferably, the heat sink has a plurality of second grooves formed thereon and the plurality of second grooves have dispositions corresponding to those of the plurality of first grooves.

Preferably, the plurality of first and the second grooves are the buffer areas when the flexible substrate is bent.

Preferably, the at least one electronic device is disposed on the at least one platform.

Preferably, the heat spreader is formed by one selected from the group consisting of copper, aluminum, and graphite.

Based on the above, each of the abovementioned flexible substrate, circuit board and optoelectronic device provided in the present invention simultaneously has the flexibility and the heat dissipation ability, and is especially suitable for the high power electronics application.

The above objects and advantages of the present invention will become more readily apparent to those ordinarily skilled in the art after reviewing the following detailed descriptions and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purposes of illustration and description only; it is not intended to be exhaustive or to be limited to the precise form disclosed.

Figure 1:
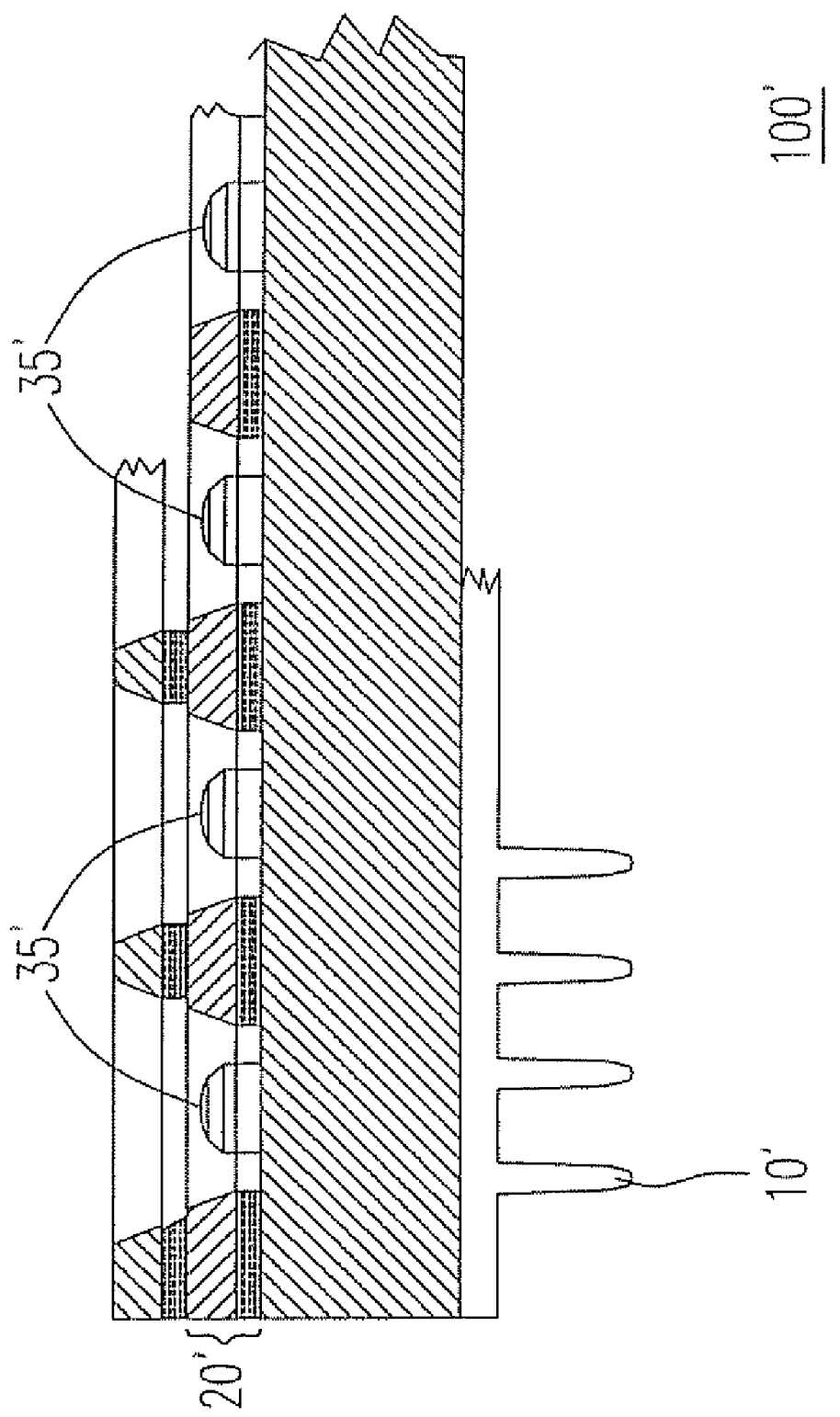
FIG. 1 is a diagram illustrating a heat dissipation circuit board having an LED optoelectronic device mounted thereon according to the prior art.
Figure 2:
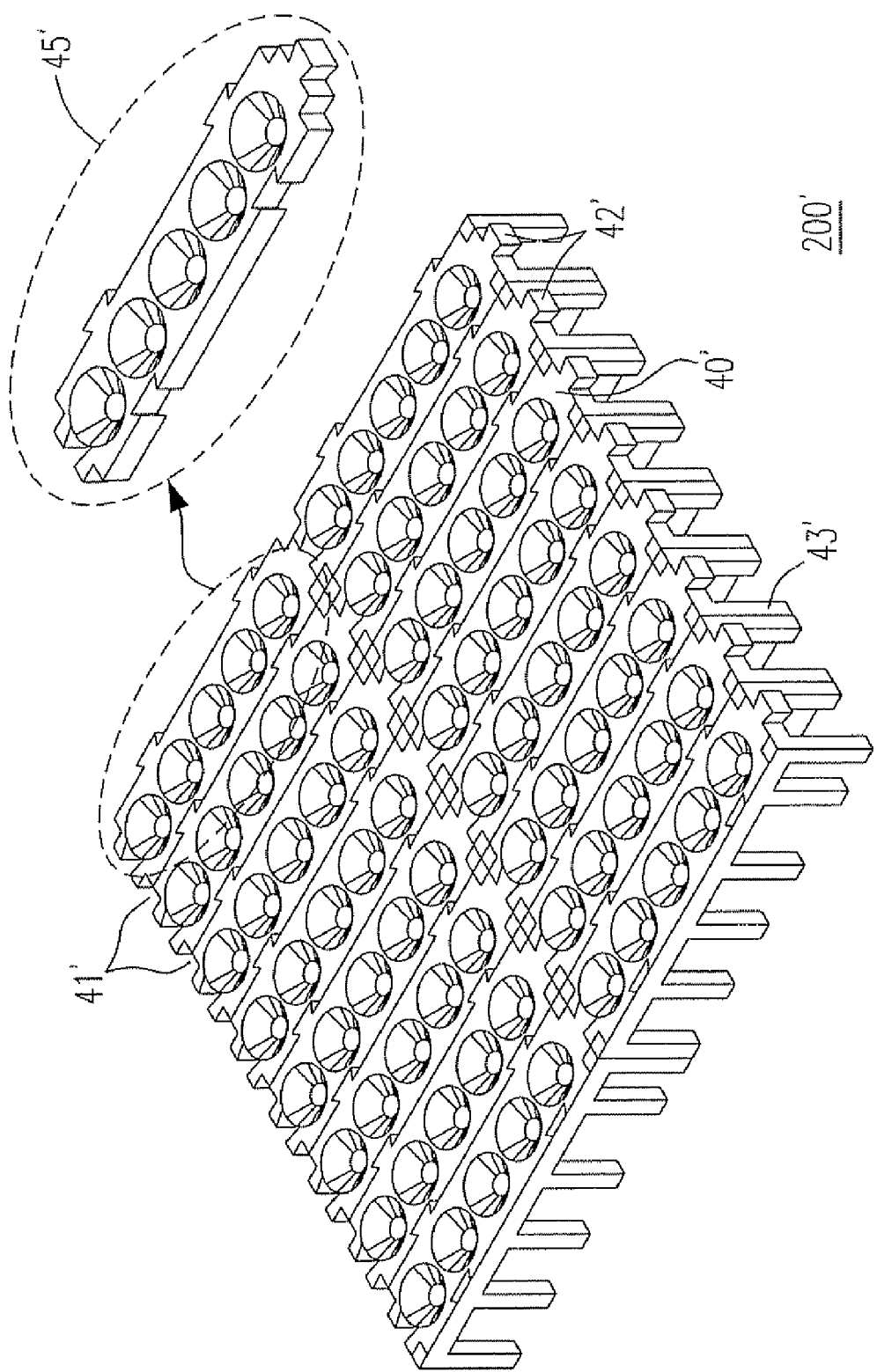
FIG. 2 is a diagram illustrating LED optoelectronic modules and the assembly thereof according to the prior art.
Figure 3:
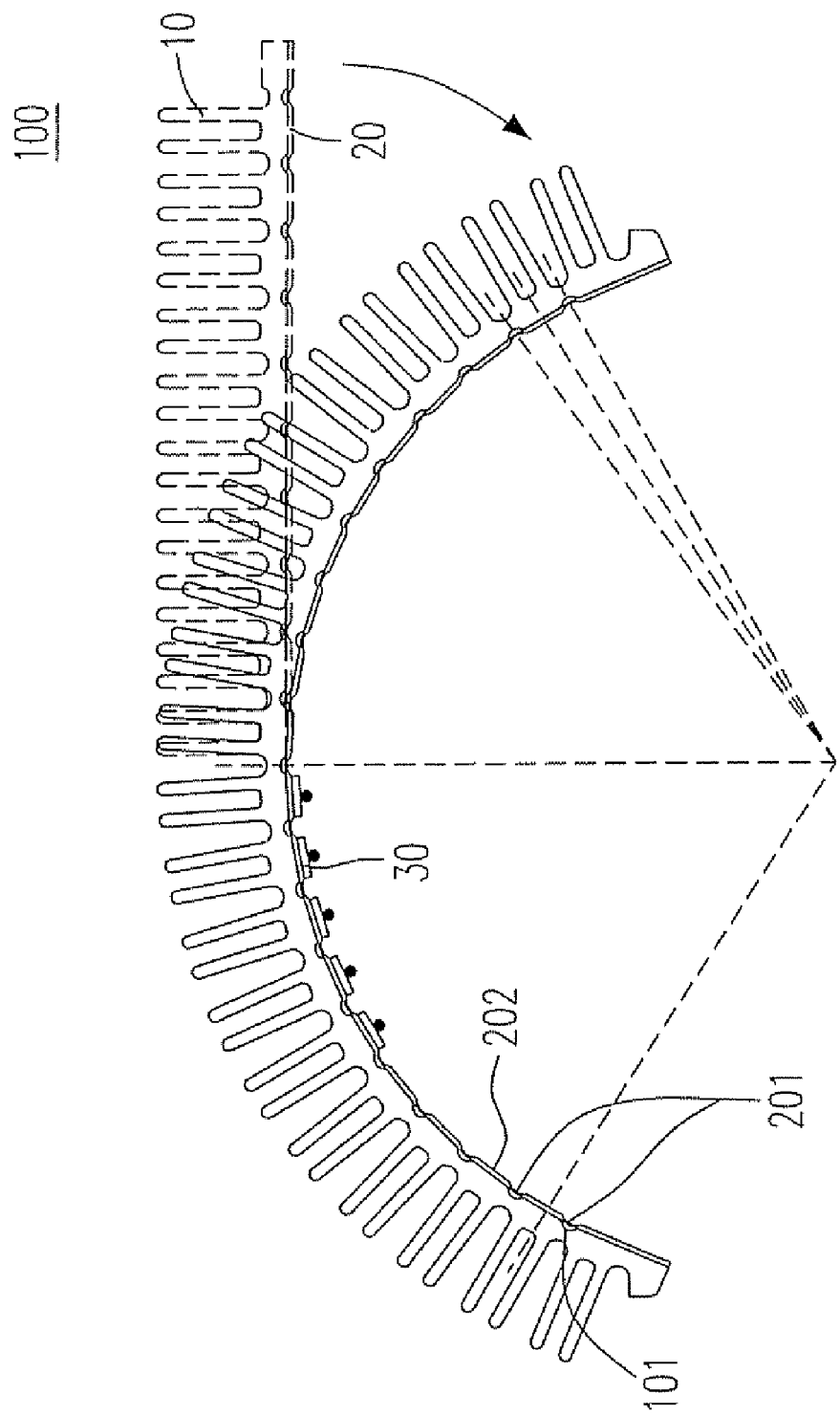
FIG. 3 is a diagram schematically illustrating a flexible heat dissipation substrate according to an embodiment of the present invention.

Please refer to FIG. 3, which shows a flexible heat dissipation substrate according to an embodiment of the present invention. The flexible heat dissipation substrate 100 includes a heat sink 10 and a heat spreader 20. For the flexibility purpose, a plurality of first and second grooves 101, 201 are formed on the respective upper surfaces of the heat sink 10 and the heat spreader 20, and the position of each of the first grooves 201 is corresponding to each of the second grooves 101, so as to provide an area for buffering the deformation of the substrate 100 when it is bent. In an alternative embodiment of the present invention, the first and the second grooves respectively formed on the respective upper sides of the heat sink 10 and the heat spreader 20 are arranged in a regular pattern, such as a parallel arrangement, a radiation arrangement, or a cross arrangement, in order to provide the desired flexibility. However, it should be noted that the position of each of the first grooves 201 must be corresponding to each of the second grooves 101 no matter what kinds of patterns they are arranged. It also can be known from FIG. 3 that the flexible heat dissipation substrate 100 is first processed in a planar state, in which the first and the second grooves 101, 201 are respectively formed on the heat sink 10 and the heat spreader 20. After the first and the second grooves 201, 101 are formed, the heat sink 10 and the heat spreader 20 are bonded together to form the flexible heat dissipation substrate 100 which is still maintained in the planar state. In the next step, the flexible heat dissipation substrate 100 is bent to a particular curve according to actual needs.

In a preferred embodiment, the heat spreader is formed by a relatively high heat conduction material, such as the metallic material like the copper and the aluminum or the non-metallic material like the graphite. Furthermore, the outer side (the side opposite the side attached to the heat spreader) of the heat sink 10 usually has a plurality of fin structures formed thereon for enhancing the heat dissipation ability thereof.

Furthermore, in a further embodiment of the present invention, at least one circuit board 30 can be mounted on a platform 202 of the heat spreader 20, which is formed between two adjacent first grooves 201, as shown in FIG. 3. Generally, the circuit board 30 further includes an insulation layer and an electrically conductive layer (not shown). The insulation layer (not shown) is usually formed by one of a resin material and a ceramic material, so as to bond the circuit board 30 to the heat spreader 20. The electrically conductive layer is usually formed by a metal material, such as copper, and has a particular circuit pattern (not shown) formed thereon.

Figure 4:
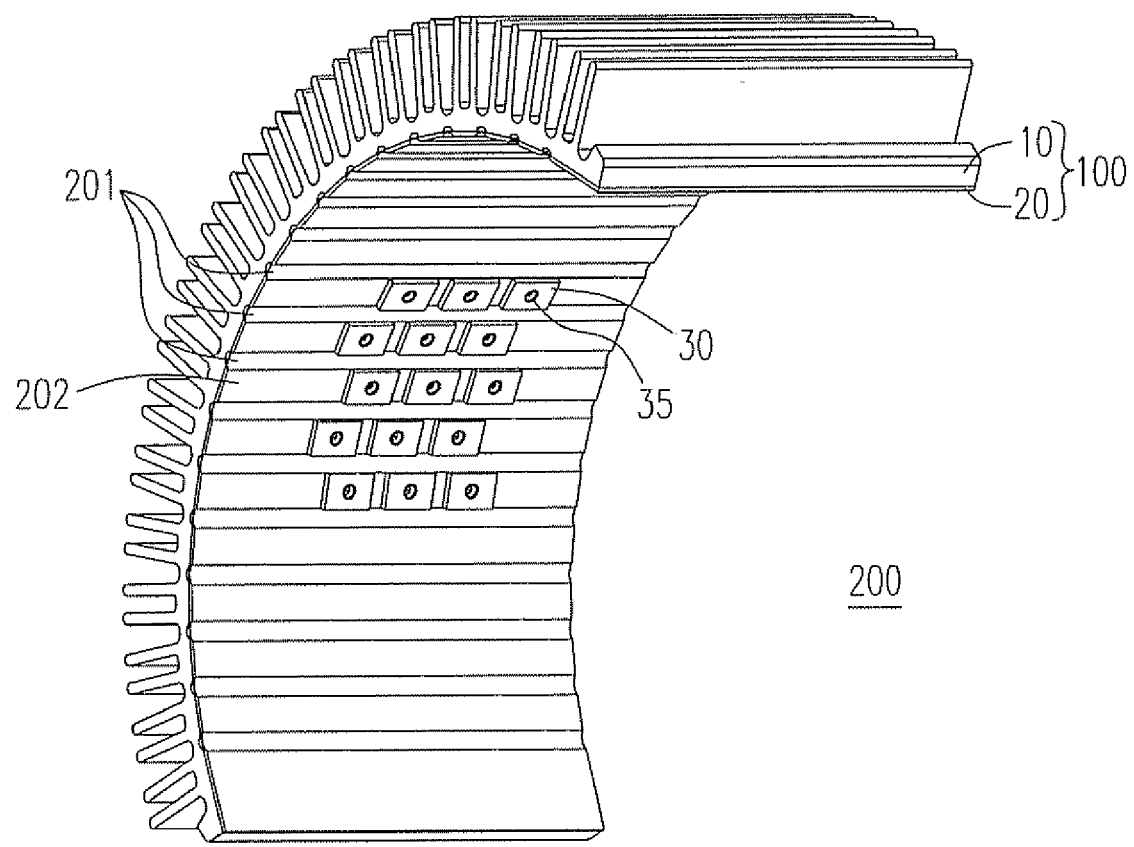
FIG. 4 is a diagram illustrating a flexible optoelectronic device according to a further embodiment of the present invention.

Please further refer to FIG. 4, which shows a flexible optoelectronic device according to a further embodiment of the present invention. As shown in FIG. 4, the flexible optoelectronic device 200 is formed by the flexible substrate 100 shown in FIG. 3 and a plurality of LED package modules 35. Accordingly, the flexible substrate 100 similarly includes a heat sink 10 and a heat spreader 20 having a plurality of first grooves 201 formed thereon. A platform 202 is also formed between two adjacent first grooves 201 for mounting the plural LED modules 35. As described above, the plural first grooves 201 are used for providing the buffer spaces (or areas) for the deformation caused by the bending of the flexible substrate 100. Therefore, the device shown in FIG. 4 is especially advantageous for the application for LED modules since the lighting path of each of the LED modules 35 can be adjustable by changing the widths of the plural first grooves 201. Meanwhile, as described above, each of the LED modules 35 is mounted on the platform 202 through the circuit board 30.

Based on the above, the flexible substrate 100 and the flexible optoelectronic device 200 of the present invention can be bent based on the desired application. Accordingly, the flexible substrate 100 and the flexible optoelectronic device are especially applicable for the beauty instruments or the curved displays or spotlights. While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A flexible substrate, comprising:
   at least one circuit board having an insulation layer and at lease one conductive layer formed thereon, wherein the at least one conductive layer is patterned to form a circuit;
   a heat spreader having a first upper surface and a first lower surface, wherein the first upper surface has a plurality of first grooves formed thereon;

at least one platform formed between two adjacent ones of the first grooves on the first upper surface of the heat spreader for mounting the at least one circuit board; and a heat sink having a second upper surface and a second lower surface, wherein the second upper surface has a plurality of second grooves formed thereon and is connected to the first lower surface of the heat spreader.

2. The flexible substrate according to claim 1, wherein the plurality of first and the plurality of second grooves are the buffer areas when the flexible substrate is bent.

3. The flexible substrate according to claim 1, wherein the plurality of second grooves on the second upper surface have dispositions corresponding to those of the plurality of first grooves on the first upper surface.

4. The flexible substrate according to claim 1, wherein the insulation layer is formed by one of a resin material and a ceramic material.

5. The flexible substrate according to claim 1, wherein the conductive layer is formed by a metal material.

6. The flexible substrate according to claim 1, wherein the heat spreader is formed by the one selected from the group consisting of copper, aluminum, and graphite.

7. The flexible substrate according to claim 1, wherein the second lower surface further comprises a plurality of fins formed thereon.

8. A flexible optoelectronic device, comprising:
  at least one circuit board having an LED package module formed thereon;
  a heat spreader having a plurality of grooves formed thereon;
  at least one platform formed between two adjacent ones of the plurality of grooves on the heat spreader for mounting the circuit board; and
  a heat sink attached to the heat spreader for absorbing a heat from the heat spreader.

9. The flexible optoelectronic device according to claim 8, wherein the plurality of grooves are the buffer areas when the flexible optoelectronic device is bent.

10. The flexible optoelectronic device according to claim 8, wherein the LED package module has an irradiation direction which is adjustable by deforming widths of the grooves.

11. The flexible optoelectronic device according to claim 8, wherein the heat sink further comprises a plurality of fins.

12. The flexible optoelectronic device according to claim 8, wherein the at least one circuit board has a resin substrate.

13. The flexible optoelectronic device according to claim 8, wherein the heat aluminum, and graphite.

14. A flexible substrate, comprising:
  a heat spreader having a plurality of first grooves formed thereon and at least one platform formed between two adjacent ones of the plurality of first grooves; and
  a heat sink attached to the heat spreader, wherein the heat sink has a plurality of second grooves formed thereon and the plurality of second grooves have dispositions corresponding to those of the plurality of first grooves.

15. The flexible substrate according to claim 14, wherein the plurality of first and second grooves are the buffer areas when the flexible substrate is bent.

16. The flexible substrate according to claim 14, wherein at least one electronic device is disposed on the at least one platform.

17. The flexible substrate according to claim 14, wherein the heat spreader is formed by one selected from the group consisting of copper, aluminum, and graphite.

* * * * *